US006429677B1

(12) United States Patent
Montrose

(10) Patent No.: US 6,429,677 B1
(45) Date of Patent: Aug. 6, 2002

(54) METHOD AND APPARATUS FOR CHARACTERIZATION OF GATE DIELECTRICS

(75) Inventor: Charles Montrose, Clintondale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/501,654

(22) Filed: Feb. 10, 2000

(51) Int. Cl.[7] ............................................. G01R 21/26
(52) U.S. Cl. ................................. 324/765; 324/158.1
(58) Field of Search ................................ 324/754, 755, 324/757, 758, 765, 158.1

(56) References Cited

U.S. PATENT DOCUMENTS

| | | | |
|---|---|---|---|
| RE31,056 E | | 10/1982 | Chau et al. |
| 4,956,602 A | * | 9/1990 | Parrish ........................ 324/537 |
| 4,961,053 A | * | 10/1990 | Krug ........................... 324/537 |
| 4,989,209 A | | 1/1991 | Littlebury et al. |
| 5,389,556 A | * | 2/1995 | Rostoker et al. .............. 438/17 |
| 5,696,773 A | | 12/1997 | Miller |
| 5,898,706 A | | 4/1999 | Dufresne et al. |
| 5,907,247 A | * | 5/1999 | Vogley ........................ 324/765 |
| 5,929,650 A | * | 7/1999 | Pappert et al. ............... 324/763 |

* cited by examiner

Primary Examiner—Michael Sherry
Assistant Examiner—Russell M. Kobert
(74) Attorney, Agent, or Firm—Jay Anderson; Cantor Colburn LLP

(57) ABSTRACT

An apparatus for monitoring and recording multiple gate dielectric leakage currents during a reliability characterization test. The large number of devices tested allows for longer testing at lower voltages thereby minimizing the need to rely on mathematical models. Solid-state multiplexers (MUX) at multiple levels of test apparatus assembly eliminate excess wiring and allow for constant scan monitoring of the devices under test (DUT) without concern for wearout of electromechanical switches. Data resolution is enhanced with fewer data readings per fixed time period during quiescent periods and multiple readings when the leakage current is changing more rapidly. Thus the resolution of the data is maximized during the critical phase of dielectric breakdown allowing for more precise characterizations of gate dielectrics without the need to increase data storage.

4 Claims, 5 Drawing Sheets

METHOD AND APPARATUS FOR CHARACTERIZATION OF GATE DIELECTRICS

BACKGROUND OF THE INVENTION

The invention relates to the field of reliability testing of integrated circuits. More particularly, the invention relates to an apparatus and method for reliability stressing of thin gate and node dielectrics for low voltage technologies.

Semiconductor manufacturers who make integrated circuit chips begin by manufacturing semiconductor wafers. Each wafer is typically 100 mm, 125 mm, 150 mm, 200 mm or 300 mm in diameter and contains anywhere from one to several thousand chips or die on the wafer. When manufacture of the wafer is completed, chips or die are cut or "diced" from the wafer and may later be mounted into single chip or multiple chip packages for implementation in a printed circuit board or other applications.

When manufacture of a wafer is completed, it is customary practice to test each chip on the wafer to determine whether each chip, as manufactured, electrically matches design criteria, matches performance criteria of the system in which the chip is to be implemented, and will be reliable in operation.

Logic circuit manufacturers routinely perform both logic and parametric tests on their products. To test the "logic" of a circuit, a typical tester stimulates various terminals of the circuit with input logic signals while monitoring various output logic signals produced by the tester in response to the input logic signal stimulus to determine if the output signals exhibit expected logic patterns. A "parametric" test measures analog characteristics of the circuit at its terminals. One of the most important parametric characteristics of a logic circuit is its leakage current, the amount of current an input terminal of a logic circuit sources or sinks when the terminal is driven to a high or low logic level. Leakage current is typically measured by connecting the terminal to a voltage source through a precision resistor and measuring the voltage drop across the resistor. Multiple devices are tested in parallel. The voltage drop is proportional to the leakage current. The possibility of excessive leakage creates difficulty in selecting an appropriate resistor value. A small value resistor potentially allows excessive current drain under device short circuit conditions and causes too small of a voltage drop for precise characterization for normal leakage readings. Conversely, a large resistor value will cause in a large voltage drop resulting in excessive impact on the stress voltages being applied to the device under test (DUT).

Reliability "logic" testing is used to screen out chips having an undesirably short life span. Typically, a significant percentage of a group of chips will fail early in their lifetime due to marginal conditions during manufacture. Subsequently, a very low percentage of the group will fail during an extended period of use of the chips. Reliability screening of semiconductor chips is typically performed by a process of supplying test signal patterns to chips under test to repeatedly stimulate all devices and wires on a chip, and is typically performed at elevated temperatures and/or voltages to simulate the first six months of operation. Therefore, the screening procedure is known as burn-in.

Reliability engineering "parametric" testing of integrated circuits is used to predict product lifetimes and calculate defect densities over the life of the component. In particular, the characterization of gate dielectric leakage currents provides reliability engineers with information critical to life cycle predictions. This process of characterization has historically been time consuming and expensive for semiconductor manufacturers. To accomplish this in a short time, it is necessary to subject product samples to environmental conditions that accelerate the failure modes that cause wearout.

Typical methods for creating these stress conditions include the use of temperature and voltage such that the temperature stress used for testing exceeds the operating temperature stress when the circuit is in actual use, and such that the stress voltage used for testing exceeds the operating voltage when the circuit is in actual use.

Voltage acceleration has been used as the primary factor for gate and node dielectric stressing throughout CMOS history. Mathematical models were then applied in order to project a characterization of the dielectric from stressed testing conditions. Typically, gate dielectrics are subjected to stress voltage levels for a period of time. The voltage is then lowered to the normal operating levels and the leakage current measured. This is referred to as stress induced leakage current (SILC) testing. SILC testing is often performed at additional voltages close to nominal operating levels for more robust characterizations.

Many manufacturers have attempted to address low throughput of burn-in and characterization processes by creating burn-in boards onto which many diced chips are placed in chip packages, and then the packages go into sockets on the burn-in boards. Thereafter, each chip on the test board is simultaneously exercised. Thus, many chips are burned-in at once. These systems effectively reduce the time required to burn-in a large volume of chips.

However, the increased number of diced chips also increases the physical complexity of taking data. In the case of gate dielectric leakage current characterization, each device requires a read back of voltage and current which is two pairs of wires for every device on the board. These wires multiply quickly to create fragile connections and unwieldy boards.

For the forgoing reasons, there is a need for an apparatus and simple method of measuring the leakage current of a large number of gate dielectrics over an extended period of time in a fully automated way. Additionally, there is a need for lowering acceleration of life stress voltages thereby giving longer test times without sacrificing throughput.

BRIEF SUMMARY OF THE INVENTION

The present invention is directed to an apparatus and method for reliability characterization of integrated circuit dice gate dielectrics by monitoring of leakage current. Pursuant to the present invention, provision is made for the continual monitoring of the gate dielectric leakage current on each of a plurality of devices.

The teachings of the invention are in three principal areas. The first is an apparatus for monitoring and recording multiple gate dielectric leakage currents during a reliability characterization test. The large number of devices tested allows for longer testing at lower voltages thereby minimizing the need to rely on mathematical models to project dielectric characteristics. The apparatus employs on board solid-state multiplexers (MUX) at multiple levels of test apparatus assembly to eliminate excess wiring and allow for constant scan monitoring of the DUTs without concern for wearout of electro-mechanical switches. The MUXs and DUTs are mounted on circuit cards wherein connections are made by circuit runs on the cards. With appropriate addressing, the MUXs allow for a single output to accommodate all DUT measurements thus eliminating wires from each DUT.

The present invention provides a second inventive approach for selectively recording the data resultant from the constant scanning of the leakage currents. In accordance with this aspect of the invention, fewer data readings per fixed time period are stored during quiescent periods and multiple readings are stored when the leakage current is changing more rapidly. Thus the resolution of the data is maximized during the critical phase of dielectric breakdown allowing for more precise characterizations of gate dielectrics without the need to increase data storage.

The third inventive facet of the invention is an efficient and expeditious methodology for assuring the accuracy of the readings when switching between voltage stress levels. Constant voltage levels are supplied to the DUTs by circuitry employing operational amplifiers (op-amps) commonly known to those of ordinary skill in the art. The output of an op-amp is affected by inherent characteristics that vary with the input voltage level. The most important of these is DC offset voltage. Typically, potentiometers, or other hardware changes, are employed to "null out" the offset. These potentiometers require resetting whenever the input voltage level is changed (which changes the common mode voltage at the inputs) as is required whenever the test voltage is changed from the stress level to the, possibly multiple, SILC level(s). This is both impracticable and prohibitive. The inventive methodology stores the offset values at each voltage input level required for each DUT channel. The unique combination of voltage level and DUT channel provide an entry into an error correction matrix where these error correction factors are stored. These values are then applied as correction factors to the leakage value calculated and stored. No operator intervention is required between readings and accuracy is maintained at all voltage levels.

A better understanding of the features and advantages of the present invention will be obtained by reference to the following detailed description of the invention and accompanying drawings which set forth an illustrative embodiment in which the principles of the invention are utilized.

BRIEF DESCRIPTION OF THE DRAWINGS

A better understanding of the features and advantages of the present invention will become better understood with regard to the following detailed description, appended claims, and the accompanying drawings where:

DETAILED DESCRIPTION OF THE INVENTION

Figure 1:
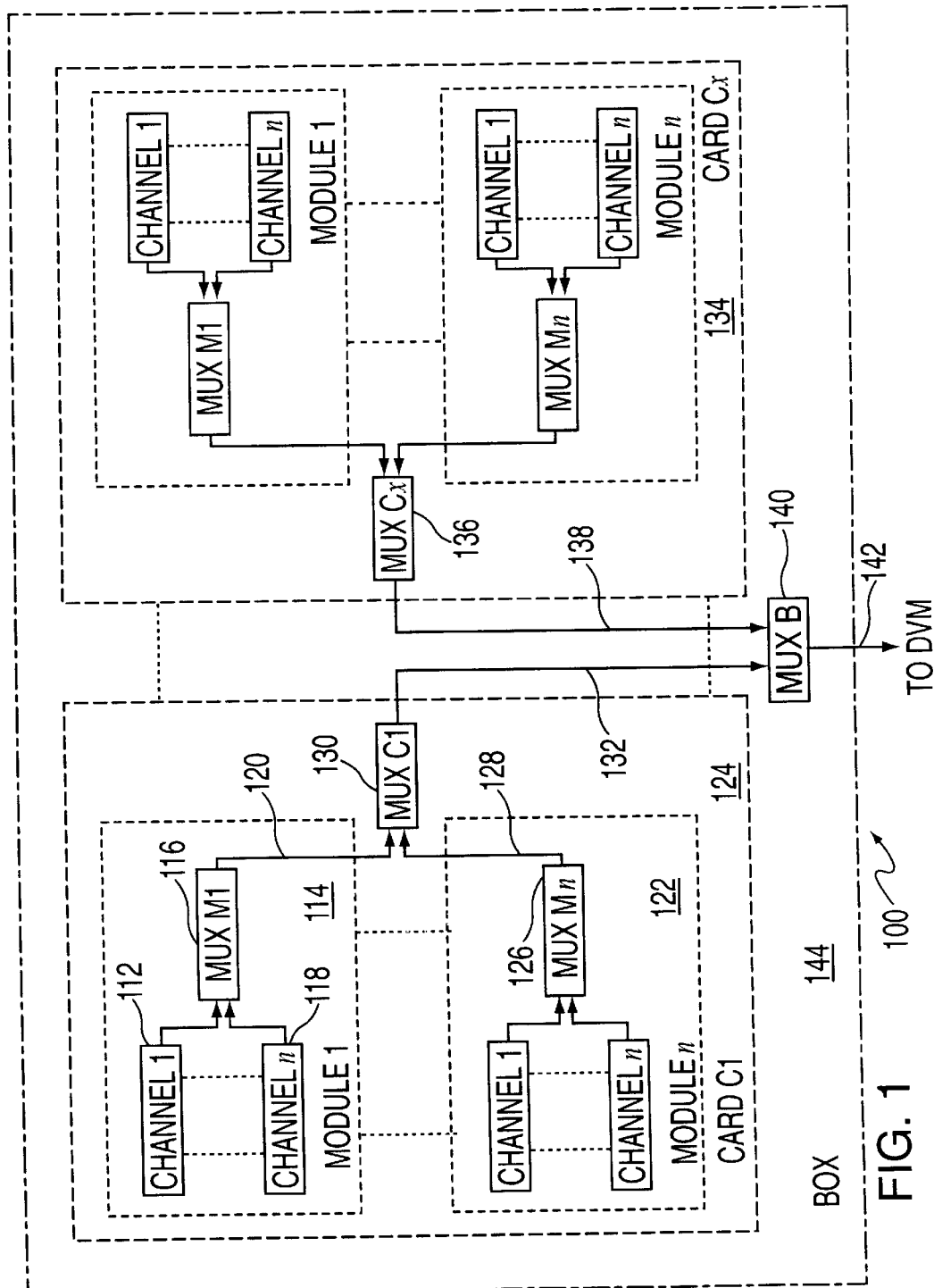
FIG. 1 shows a functional block diagram of the apparatus of the present invention.

Referring initially to FIG. 1, there is shown an apparatus in accordance with an embodiment of the invention. Generally, the electrical characterization of the semiconductor devices is performed with the chips mounted in carriers and thereafter tested in parallel. A channel 1 monitor 112 mounted on a module 1 114 supplies a constant voltage to DUT 1 (not shown) and is arranged to provide a voltage and current measurement from the DUT. These measurements are provided to module multiplexer (MUX) M1 116. Appropriate addressing will cause module MUX M1 116 to provide specific DUT measurements on a line 120. This arrangement is replicated through channel monitor n 122. Module MUX Mn 126 provides measurements from each of its n DUTs on a line 128. Each voltage and current measurement of each channel monitor is similarly multiplexed at module MUX M1 116. Appropriate addressing will cause each of the module level MUXs to provide a specific channel monitor measurement. Card MUX C1 130 mounted on card C1 124 is arranged to receive each of the module MUX output signals from all modules 1 through n. Appropriate addressing will cause card MUX C1 130 to select the signal from a specific module MUX and provide this on a line 132. The arrangement of modules on card C1 130 is replicated x times through card Cx 134. Card MUX Cx 136 mounted on card Cx 124 is arranged to receive the module MUX output signals from all modules 1 through n on card Cx. Appropriate addressing will cause card MUX Cx 136 to select the signal from a specific module MUX and provide this on a line 138. Cards 1 through x are mounted in box or housing 144 wherein box MUX B 140 is arranged to receive the card MUX signals from each and every card level MUX, MUX C1 to Cx. Appropriate addressing of card MUX B 140 will select a specific card level MUX signal to provide to a voltmeter (DVM) or equivalent measuring device on a line 142. Hence addressing of card MUX B causes a selection of a specific card MUX Ci which is providing the signal from a specific module level MUX Mi which is further selecting only one channel monitor measurement. Thus, it will be seen that constant scan monitoring is achieved through a single output wire.

In an exemplary embodiment, 192 dice are monitored simultaneously. This allows for greatly increased throughput and, therefore, an ability to characterize the DUTs gate dielectrics by subjecting them to stress voltages for longer periods of time thereby not relying on mathematical models to extrapolate as far. Four levels of assembly, channel monitor, module, card, and box are shown respectively in FIGS. 2 through 5.

Figure 2:
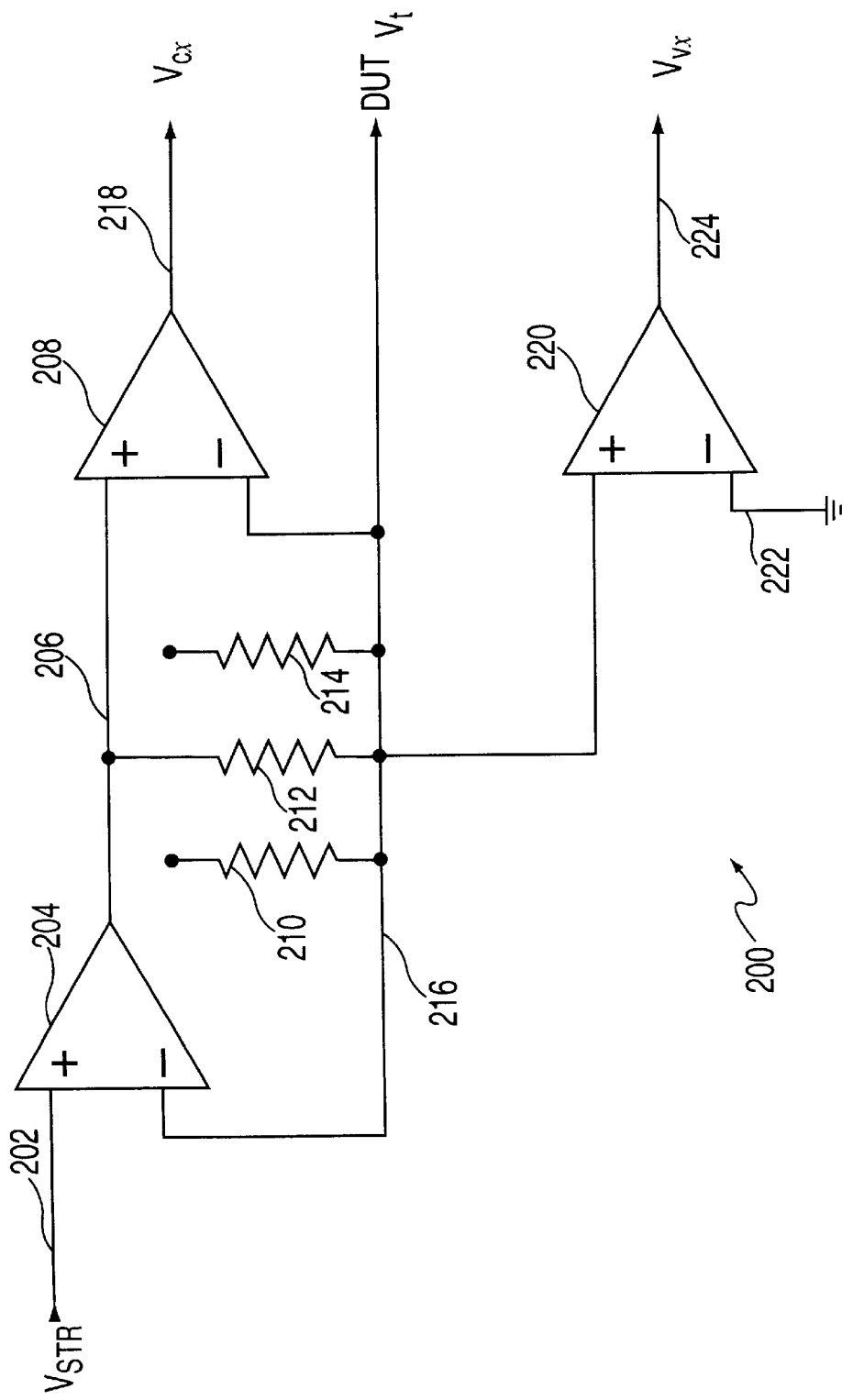
FIG. 2 shows a detailed drawing of the preferred embodiment of the channel monitors of the present invention.

A channel monitor 200 generally shown in FIG. 2 wherein detailed line matching, filtering, etc. has been eliminated to reveal the essential circuitry. The purpose of the channel monitor is threefold: (1) to supply a constant voltage to a designated DUT, (2) to report the leakage current drawn by the DUT, and (3) to report the voltage at which the leakage current is measured. Regulated input voltage is supplied on a line 202 to a non-inverting terminal of a first operational amplifier (op-amp) 204 arranged as a voltage follower. First op-amp 204 provides an output on a line 206 to a non-inverting terminal of a first instrumentation amplifier 208 and also to one of a plurality of current sensitivity resistors 210, 212, and 214. The current sensitivity resistors are precision components having a tolerance of 0.1% (or otherwise based upon the needed precision of the readings) and having a resistance based upon the expected leakage current. The selected resistor is then connected to the DUT whereby the constant stress voltage is applied and leakage current allowed to flow to the DUT on a line 216. Line 216 is also connected to an inverting terminal of the first instrumentation amplifier 208 whereby the second instrumentation amplifier detects the voltage drop across the resistor and provides an output on a line 218 which is a voltage representing the leakage current flowing through the resistor. Line 216 is also connected as a feedback resistor to an inverting terminal of the first op-amp 204 by line 216 whereby first op-amp output 206 follows the voltage at the input line 202. Line 216 is connected to a non-inverting terminal of a second instrumentation amplifier 220. An inverting terminal of the second instrumentation amplifier 220 is connected to circuit ground by a line 222 so that an output of the second instrumentation amplifier on line 224 reports the voltage at which the leakage current is measured.

Figure 3:
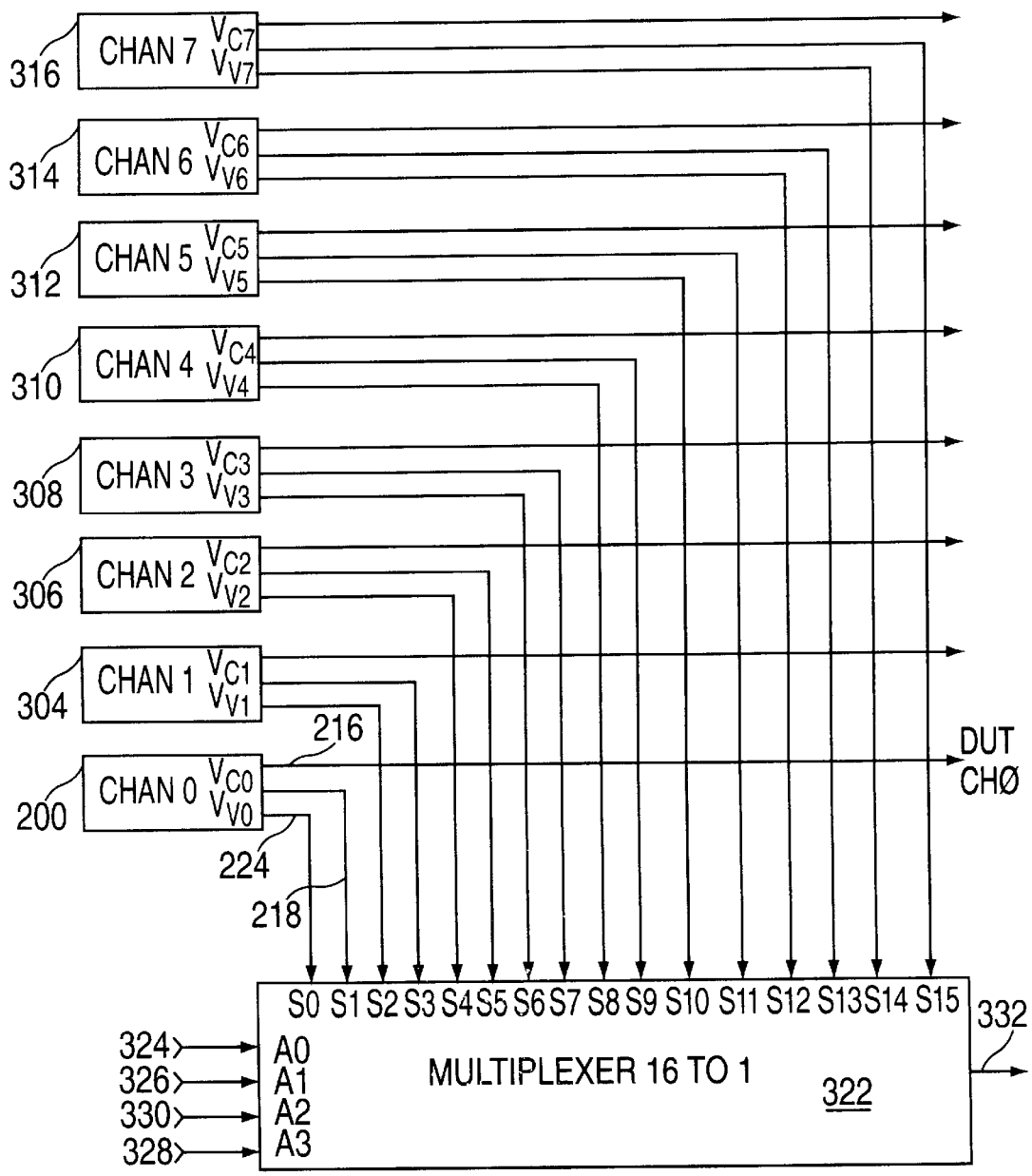
FIG. 3 shows a detailed drawing of the preferred embodiment of the module level of the present invention incorporating eight channel monitors.

The module level 300 of the present apparatus is generally shown in FIG. 3. At the module level eight (8) channel monitors, 200, 304 through 316 are mounted and their outputs multiplexed together. Each monitor provides three (3) outputs, as described above. The constant voltage output from channel monitor 0 200 is passed on to its designated DUT on line 216. The channel 7 316 outputs representing the leakage current and the measuring voltage on lines 218 and 224 respectively are each connected to an input of a 16 to 1 module multiplexer (MUX) 322. The outputs of the remaining seven (7) modules are connected in a corresponding manner. Module MUX 322 is arranged to receive address signals on lines 324, 326, 328, and 330. The address signals designate which one of the 16 module MUX 322 input signals to provide to a first module MUX output on a line 332. Therefore, there are nine (9) outputs from the module: eight (8) constant voltage outputs and one (1) module MUX output.

Figure 4:
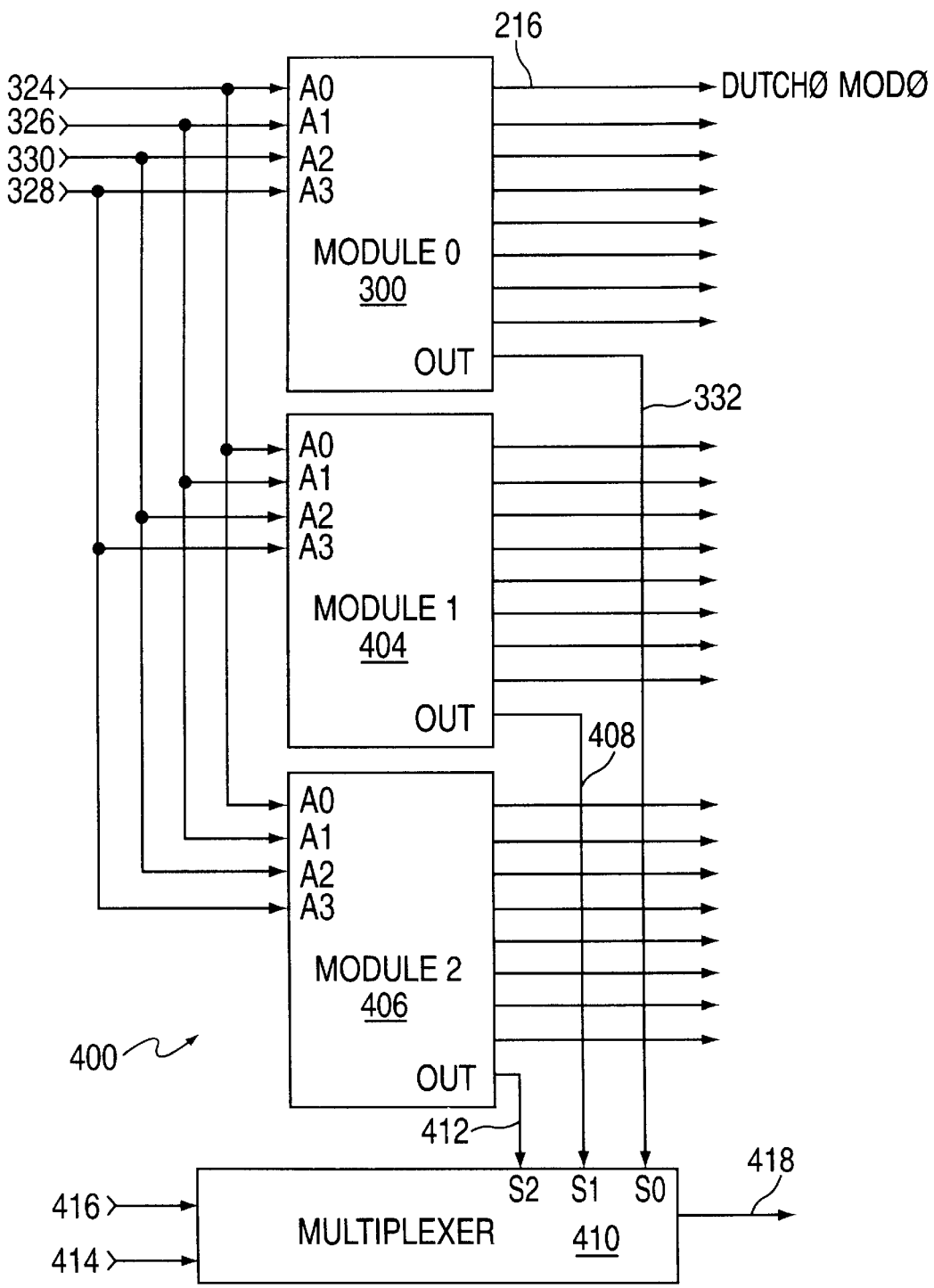
FIG. 4 shows a detailed drawing of the preferred embodiment of the card level of the present invention incorporating three modules.

The card level 400 of the present apparatus is generally shown in FIG. 4. Three (3) modules, 300, 404, and 406, are mounted on each card. The eight (8) constant voltage outputs from each module are passed through for connection to their designated DUTs with constant voltage from channel 0 to module 0 on line 216 shown as an explicit example. The module MUX output from module 0 300 is connected to a card MUX 410 via line 332. In a like manner, module MUX outputs from module 1 404 and module 2 406 are also connected to the card MUX 410 via lines 408 and 412, respectively. Card MUX 410 is arranged to receive address lines 414 and 416 that will designate which of the three (3) module MUX outputs is provided to a card MUX output on a line 418.

Figure 5:
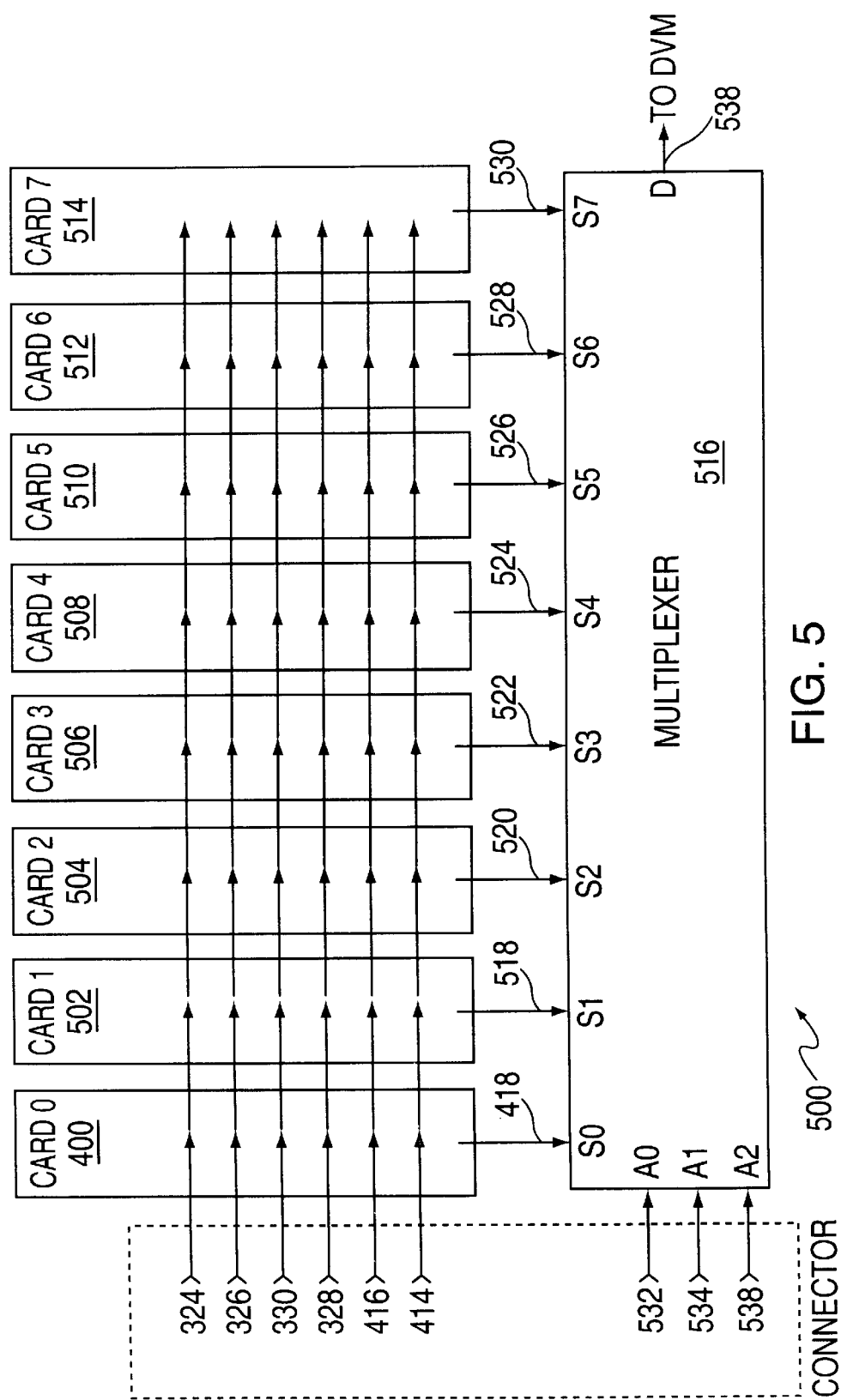
FIG. 5 shows a detailed drawing of the preferred embodiment of the box level of the present invention incorporating eight cards, a total of 192 DUTs.

The box level 500 of the present apparatus is generally shown in FIG. 5. Eight (8) cards 400, and 502 through 514, are in the box 500. The card MUX output from card 0 400 is connected to a box MUX 516 via line 418. In a like manner, card MUX outputs from cards 1 502 through card 7 514 are connected to the box MUX 516 via lines 518 through 530 respectively. Box MUX 516 is arranged to receive address lines 532, 534, and 536 that will designate which of the eight (8) card MUX outputs is provided to a box MUX output on a line 538. Line 538, in turn, is connected to a voltage measuring device (not shown) for measuring DUT leakage current and measuring voltage levels and thus providing data for characterizing the gate dielectric.

Channel selection address lines 324, 326, 330, and 328; module selection address lines 414 and 416; and card selection address lines 534 and 536; are all made available to an addressing device such as a computer through an electrical signal connection means such as a PC parallel port connector. Thus a specific signal (either leakage current or measurement voltage) from a particular DUT is made available to the voltage measuring device on line 538 by providing a specific card, module, and channel address. Further, automatic means for addressing is employed to constantly scan all the DUTs with the output of the results from the voltage measuring device recorded within a computer memory.

A feature of the invention is embodied within the methodology of recording the resultant data measurements. Greater resolution of the characterization data is achieved by taking more measurements during intervals of larger changes in leakage current. The criterion for recordation of data in the computer memory is either time or magnitude of change in leakage current. Hence, if a scanned leakage current exceeds a predetermined amount, the computer will request recordation of a reading otherwise a reading will be recorded only after passage of a designated time interval. Increasing the designated time interval reduces the amount of data storage required for each device multiplied by the number of devices over the length of the test. For devices that are failing, the computer will be requesting multiple readings as the leakage increases (or decreases) thus providing greater resolution of the dielectric breakdown characteristics during the critical failure phase.

A further feature of the present invention is the novel methodology for nulling out the error factors associated with the DC offset voltage. Leakage Testing is typically performed for at least two voltage levels: leakage current at stress level voltage, and stress induced leakage current (SILC) performed at or near operating voltages. Since DC offset voltage varies with op-amp input (common mode) voltage, whenever the test voltage is changed from the stress level to the, possibly multiple; SILC level(s) the nulling of the DC offset must be changed as well. This is both impracticable and prohibitive. The inventive methodology stores the offset values at each voltage input level required for each DUT channel as an error correction factor. The unique combination of voltage level and DUT channel provide an entry into an error correction matrix where these error correction factors are stored. These values are then applied as correction factors to the leakage value calculated and stored. No operator intervention is required between readings.

The present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While a preferred embodiment has been shown and described, various modifications and substitutions may be made thereto without departing from the spirit and scope of the invention. Accordingly, it is to be understood that the present invention has been described by way of illustration and not limitation.

What is claimed is:

1. An apparatus for monitoring electrical characteristics of a plurality of semiconductor devices under test (DUT), the apparatus comprising:

a plurality of channel monitors, corresponding to the plurality of DUTs, said plurality of channel monitors for respectively applying a test voltage to each of the plurality of DUTs, each of said plurality of channel monitors further providing one or more measurement outputs therefrom, said one or more measurement outputs from a given channel monitor being reflective of the electrical characteristics of a corresponding one of the plurality of DUTs;

a plurality of modules, said plurality of modules each containing a subset of said plurality of channel monitors therein, each of said plurality of modules further including a module-level multiplexer, each of said module-level multiplexers providing a selected module-level multiplexer output from said one or more measurement outputs inputted thereto;

a plurality of cards, said plurality of cards each containing a subset of said plurality of modules therein, each of said plurality of cards further including a card-level multiplexer, each of said card-level multiplexers providing a selected card-level multiplexer output from said module-level multiplexer outputs inputted thereto; and a housing, said housing containing said plurality of cards therein, said housing further including a housing-level multiplexer, said housing-level multiplexer providing a selected housing-level multiplexer output from said card-level multiplexer outputs inputted thereto.

2. The apparatus of claim 1, wherein each of the plurality of DUTs is mounted within a chip carrier.

3. The apparatus of claim 2, wherein said one or more measurement outputs from a given channel monitor further comprise:

said test voltage applied to said corresponding DUT by said given channel monitor; and leakage current drawn by said corresponding DUT.

4. The apparatus of claim 3, wherein each of said plurality of channel monitors further comprise:

an operational amplifier coupled to a constant voltage source at a non-inverting terminal of said operational amplifier, said operational amplifier thereby providing a constant voltage value for said test voltage applied to said corresponding DUT;

a resistor having a first end and a second end, said first end connected to an output of said operational amplifier and said second end connected to an inverting terminal of said first operational amplifier, wherein said operational amplifier is arranged as a voltage follower, and said second end of said resistor further being coupled to said corresponding DUT;

a first instrumentation amplifier having a non-inverting terminal thereof coupled to said output of said operational amplifier, and an inverting terminal thereof coupled to said inverting terminal of said first operational amplifier, said first instrumentation amplifier providing an output proportional to a current drawn through said resistor; and a second instrumentation amplifier having a non-inverting terminal thereof connected to said second end of said resistor and an inverting terminal thereof coupled to ground, said second instrumentation amplifier providing a voltage output proportional to said constant voltage value for said test voltage applied to said corresponding DUT.

* * * * *